(12) United States Patent
Wu

(10) Patent No.: US 11,626,873 B2
(45) Date of Patent: Apr. 11, 2023

(54) OFF CHIP DRIVER CIRCUIT, OFF CHIP DRIVER SYSTEM, AND METHOD FOR OPERATING AN OFF CHIP DRIVER CIRCUIT

(71) Applicant: NANYA TECHNOLOGY CORPORATION, New Taipei (TW)

(72) Inventor: Chang-Ting Wu, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 19 days.

(21) Appl. No.: 17/327,764

(22) Filed: May 24, 2021

(65) Prior Publication Data
US 2022/0376692 A1 Nov. 24, 2022

(51) Int. Cl.
*H03K 19/00* (2006.01)
*H03K 19/017* (2006.01)

(52) U.S. Cl.
CPC ... *H03K 19/0005* (2013.01); *H03K 19/01742* (2013.01)

(58) Field of Classification Search
CPC .............. H03K 19/00; H03K 19/0005; H03K 19/01742
USPC ........................................................ 327/108
See application file for complete search history.

(56) References Cited

U.S. PATENT DOCUMENTS

| | | | |
|---|---|---|---|
| 6,262,593 B1 * | 7/2001 | Sobelman | H03K 19/0813 326/35 |
| 2006/0087339 A1 * | 4/2006 | Chung | H04L 25/0278 326/30 |
| 2006/0197550 A1 * | 9/2006 | Mauthe | H04L 25/0278 326/30 |
| 2015/0171863 A1 | 6/2015 | Ha | |
| 2016/0134285 A1 | 5/2016 | Ha | |
| 2017/0154668 A1 | 6/2017 | Ha | |

* cited by examiner

*Primary Examiner* — Menatoallah Youssef
*Assistant Examiner* — Dave Mattison
(74) *Attorney, Agent, or Firm* — CKC & Partners Co., LLC

(57) ABSTRACT

An off chip driver circuit includes a pull-up circuit and a pull-down circuit. The pull-up circuit includes several first transistors and a first resistance circuit coupled between the first transistors and a input/output pad. The first transistors generate a first voltage to the first resistance circuit. The first resistance circuit transmits, in response to a first control signal, the first voltage to the input/output pad and to have a variable resistance according to the first control signal. The pull-down circuit includes several second transistors and a second resistance circuit coupled between the second transistors and the input/output pad. The second transistors generate a second voltage to the second resistance circuit. The second resistance circuit transmits, in response to a second control signal, the second voltage to the input/output pad and to have a variable resistance according to the second control signal.

20 Claims, 9 Drawing Sheets

US 11,626,873 B2

OFF CHIP DRIVER CIRCUIT, OFF CHIP DRIVER SYSTEM, AND METHOD FOR OPERATING AN OFF CHIP DRIVER CIRCUIT

BACKGROUND

Technical Field

The disclosure relates to an off chip driver circuit, an off chip driver system, and a method for operating an off chip driver circuit particularly to an off chip driver circuit, an off chip driver system, and a method for operating an off chip driver circuit for improving signal distortion.

Description of Related Art

With development of technology, the operation speed of the memory becomes faster and faster. In high speed data transmission, the issue of the amplitude of signal being attenuated and signal distortion has been highly considered.

Therefore, how to improve signal distortion in high speed data transmission is an important topic in this field.

SUMMARY

One aspect of the present disclosure is an off chip driver circuit including a pull-up circuit and a pull-down circuit. The pull-up circuit includes several first transistors and a first resistance circuit coupled between the first transistors and an input/output pad. The first transistors generate a first voltage to the first resistance circuit. The first resistance circuit transmits, in response to a first control signal, the first voltage to the input/output pad and to have a variable resistance according to the first control signal. The pull-down circuit includes several second transistors and a second resistance circuit coupled between the second transistors and the input/output pad. The second transistors generate a second voltage to the second resistance circuit. The second resistance circuit transmits, in response to a second control signal, the second voltage to the input/output pad and to have a variable resistance according to the second control signal.

Another aspect of the present disclosure is an off chip driver system including an off chip driver (OCD) front-end driver circuit and an off chip driver circuit. The front-end driver circuit generates a first resistance control signal and a second resistance control signal. The off chip driver circuit is coupled to the front-end driver circuit and receives the first resistance control signal and the second resistance control signal. The off chip driver circuit includes several first PMOS transistors, second PMOS transistors, several first NMOS transistors, and second NMOS transistors. The first PMOS transistors are coupled between a first voltage terminal and a first node. The second PMOS transistors are coupled in parallel between the first node and an input/output pad. The first NMOS transistors are coupled between a second voltage terminal and a second node. The second NMOS transistors are coupled in parallel between the second node and the input/output pad. The second NMOS transistors are selectively turned on in response to the second resistance control signal.

Another aspect of the present disclosure is a method for operating an off chip driver circuit. The method for operating the off chip driver circuit includes: activating, by a pull-up circuit, at least one of a plurality of charging paths between a first power rail and a input/output pad by turning on at least one of a plurality of first PMOS transistors and at least one of a plurality of second PMOS transistors that are arranged on the at least one of the plurality of charging paths; and when the at least one of the plurality of charging paths is activated, deactivating, by a pull-down circuit, a plurality of discharging paths between a second power rail, different from the first power rail, and the input/output pad by turning off a plurality of first NMOS transistors and a plurality of second NMOS transistors that are arranged on the plurality of discharging paths. First terminals of the plurality of the second PMOS transistors are connected with first terminals of the plurality of second NMOS transistors at the input/output pad.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
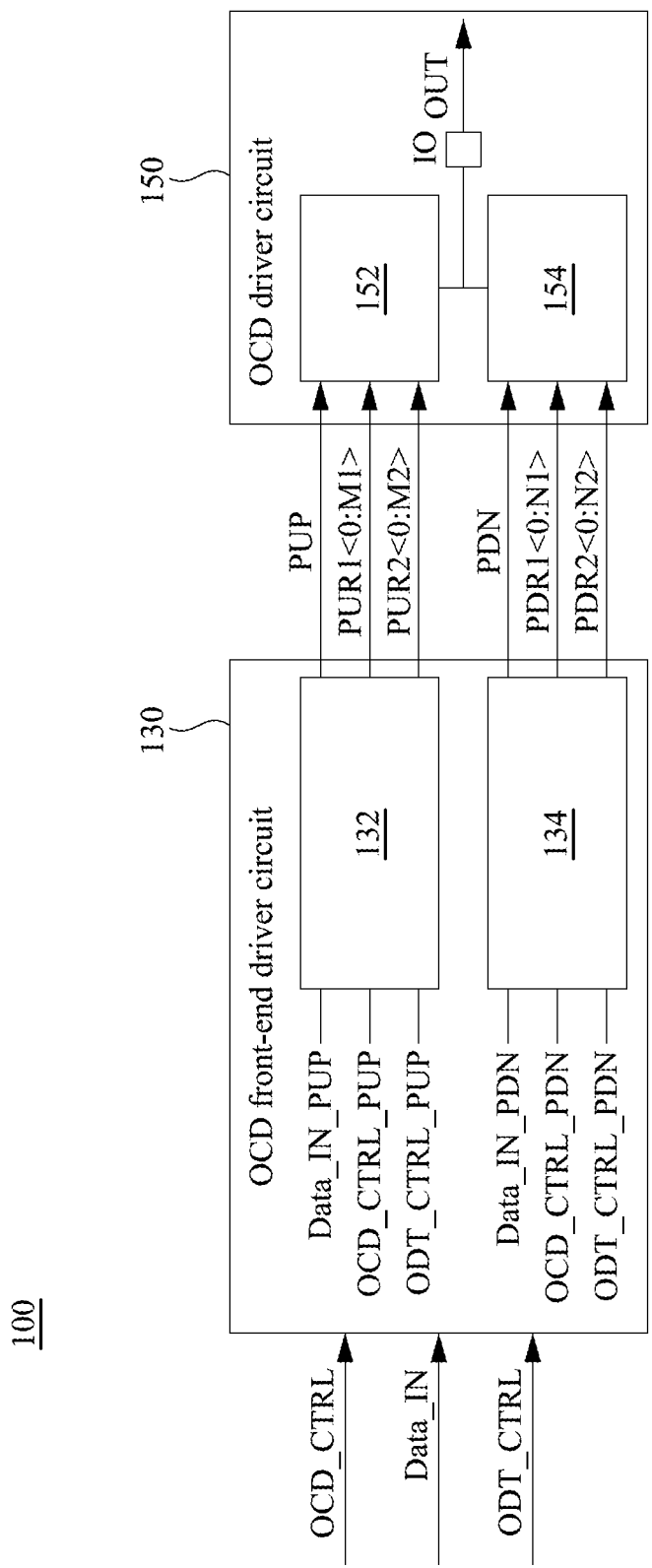
FIG. 1 is a schematic diagram illustrating an off chip driver system in accordance with some embodiments of the present disclosure.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the diagrams, some of the conventional structures and elements are shown with schematic illustrations.

In this document, the term "coupled" may also be termed "electrically coupled," and the term "connected" may be termed "electrically connected." "Coupled" and "connected" may also be used to indicate that two or more elements cooperate or interact with each other. In the following description and in the claims, the terms "include" and "comprise" are used in an open-ended fashion, and thus should be interpreted to mean "include, but not limited to."

As used herein, the term "and/or" includes any and all combinations of one or more of the associated listed items.

As semiconductor manufacturers persistently scale down feature size and drive silicon technology into better electrical and economic performance, clock speed and transmission speed often double between one generation and another, and signal integrity become a serious concern when the transition (rise and fall) times of signals become faster in many applications. In the design of memory chips, such as dynamic RAM (DRAM) and synchronous DRAM (SDRAM), off chip drivers (OCDs) are introduced to improve signal integrity when transmitting an output signal to an outside environment, such as a memory controller. Typically, the OCD generally comprises several transistors, including N-channel (NMOS) MOSFET transistors and P-channel (PMOS) MOSFET transistors configured to produce output signal (e.g., DQS and /DQS signals) via an input/output pad to the memory controller.

Correspondingly, the OCDs need to meet the requirements for high speed data transmission to maintain signal integrity. In some embodiments, the OCDs usually can produce the data signal (e.g., DQS and /DQS signals) via an input/output pad to drive an outside device (e.g., the memory controller). And, under different conditions such as a process, a voltage, and a temperature (PVT), the loads of the outside device may be different. Accordingly, the OCDs can be calibrated based on these conditions such as the process, the voltage, and the temperature (PVT) before providing the data signals to the outside device in order to maintain the signal integrity.

However, with the advancement of the memory product from DDR4 to DDR5, the operation speed of the memory device increases. In some embodiments, the OCD includes a pull-up circuit and a pull-down circuit for setting output voltage levels on the data signal produced by the OCD. Each of the pull-up circuit and the pull-down circuit include active components (e.g., transistors, amplifiers or diodes) and passive components (e.g., resistors or capacitors). The active components and the passive components in the pull-up circuit and the pull-down circuit induce internal loading effects within the OCD. In high speed data transmission, when the internal loading effects are heavy, the data signal produced by the OCD is tend to be attenuated and distorted. This phenomenon becomes severe when the operation frequency increases. For example, a slew rate of pulling high/low the output signal provided by the OCD is affected by a total loading and a driving capacity of the OCD. The total loading includes an external loading and an internal loading. The OCD provides an output signal through an input/output pad (I/O pad) to drive some external components connected with the I/O pad. The external loading is determined according to the external components connected with the I/O pad. The internal loading is determined according to internal components (e.g., transistors, resistors) and connection wirings within the OCD. The driving capacity of the OCD is determined according to parameters of the internal components (e.g., dimensions of the transistors) in the OCD. If the slew rate of pull-up/pull-down circuit is not enough, or if a slew rate of the pull-up circuit and another slew rate of the pull-down circuit are mismatched, or if the external or internal loading effect is too large, the output signal generated by the OCD will be distorted.

To solve this problem, the disclosure provides some embodiments which adopt different structures for the OCDs. For example, utilizing all active components in the pull-up circuit and the pull-down circuit between power voltage terminals and the I/O pad reduces the internal loading effect so as prevents the data signal from being distorted in high speed data transmission, and then maintains overall signal integrity when the semiconductor memory device process the data signal.

Reference is made to FIG. 1. FIG. 1 is a schematic diagram illustrating an off chip driver system 100 in accordance with some embodiments of the present disclosure. For example, when a data signal Data_IN is logic high and input to an OCD front-end driver circuit 130, the OCD front-end driver circuit 130 is configured to control an OCD driver circuit 150 to provide a high voltage to an input/output pad IO so as to output the output signal OUT with logic high. When the data signal Data_IN is logic low and input to the OCD front-end driver circuit 130, the OCD front-end driver circuit 130 is configured to control the OCD driver circuit 150 to provides a low voltage to the input/output pad IO so as to output the output signal OUT with logic low.

In operation, the OCD front-end driver circuit 130 is configured to receive control signals and the data signal Data_IN. In some embodiments, the control signals received by the OCD front-end driver circuit 130 includes multiple control signals for different functions, such as a control signal OCD_CTRL for controlling the OCD function, a control signal ODT_CTRL for controlling a On Die Termination (ODT) function and/or another control signal ZQ-Cali (not shown) for calibrating an output impedance of the OCD driver circuit 150. The control signal OCD_CTRL is input to the OCD front-end driver circuit 130 in order to control parameters of the OCD driver circuit 150 (e.g., a current value or a voltage level of the output signal generated by the OCD driver circuit 150, or a resistance of the OCD driver circuit 150 for impedance matching) according to some process, voltage, and temperature conditions (i.e., PVT conditions).

For illustration, the OCD front-end driver circuit 130 includes a pull-up front end driver circuit 132 and a pull-down front end driver circuit 134. In some embodiments, the data signal Data_IN received by the OCD front-end driver circuit 130 includes multiple data signals, such like data signals Date_IN_PUP and Date_IN_PDN. Similarly, the control signal OCD_CTRL includes multiple control signals, such like control signals OCD_CTRL_PUP and OCD_CTRL_PDN. The control signal ODT_CTRL includes multiple control signals, such like control signals ODT_CTRL_PUP and ODT_CTRL_PDN. Accordingly, the pull-up front end driver circuit 132 is configured to receive the data signal Date_IN_PUP and the control signals OCD_CTRL_PUP and ODT_CTRL_PUP, and further configured to output a pull-up control signal PUP and resistance control signals PUR1 and PUR2 to the OCD driver circuit 150. Likewise, the pull-down front end driver circuit 134 is configured to receive the data signal Date_IN_PDN and the control signals OCD_CTRL_PDN and ODT_CTRL_PDN, and further configured to output a pull-down control signal PDN and resistance control signals PDR1 and PDR2 to the OCD driver circuit 150. In some embodiments, the resistance control signals PUR1 and PUR2 are referred to as the resistance control signals PUR1<0:M1> and PUR2<0:M2>, and the resistance control signals PDR1 and PDR2 are referred to as the resistance control signals PDR1<0:N1> and PDR2<0:N2>. The configurations of the resistance control signals PUR1, PUR2, PDR1 and PDR2 will be discussed in detail in the following paragraphs.

As discussed above, the OCD front-end driver circuit 130 is configured to control the OCD driver circuit 150 according to these received control signals OCD_CTRL. The OCD driver circuit 150 is configured to receive the pull-up control signals PUP, the pull-down control signals PDN, the resistance control signals PUR1, PUR2, PDR1, and PDR2 in order to provide the output signal OUT through the input/output pad IO.

With continued reference to FIG. 1, in some embodiments, the OCD driver circuit 150 includes a pull-up circuit 152 and a pull-down circuit 154 and the input/output pad IO. For example, when the data signal Data_IN is at logic high, the OCD front-end driver circuit 130 generates the pull-up control signals PUP to trigger the pull-up circuit 152, and the pull-up circuit 152 is configured to generate the high voltage (i.e., pulling the output signal OUT to the high level, such as VDD) to the input/output pad IO in response to the pull-up control signals PUP. On the other hand, when the data signal Data_IN is at logic low, the OCD front-end driver circuit 130 generates the pull-down control signals PDN to trigger the pull-down circuit 154, the pull-down circuit 154 is configured to generate the low voltage (i.e., pulling the output signal OUT to the low level, such as VSS) to the input/output pad IO in response to the pull-down control signal PDN. The operation of the OCD driver circuit 150 will be discussed below with the reference to FIGS. 2A and 2C.

Figure 2C:
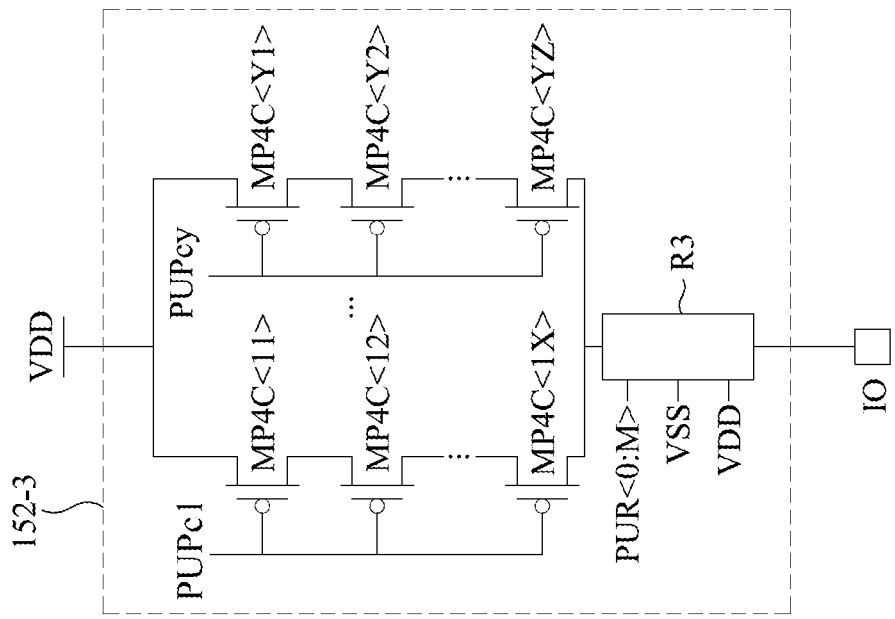
FIGS. 2A-2C are schematic diagrams illustrating pull-up units in accordance with some embodiments of the present disclosure.
Figure 2B:
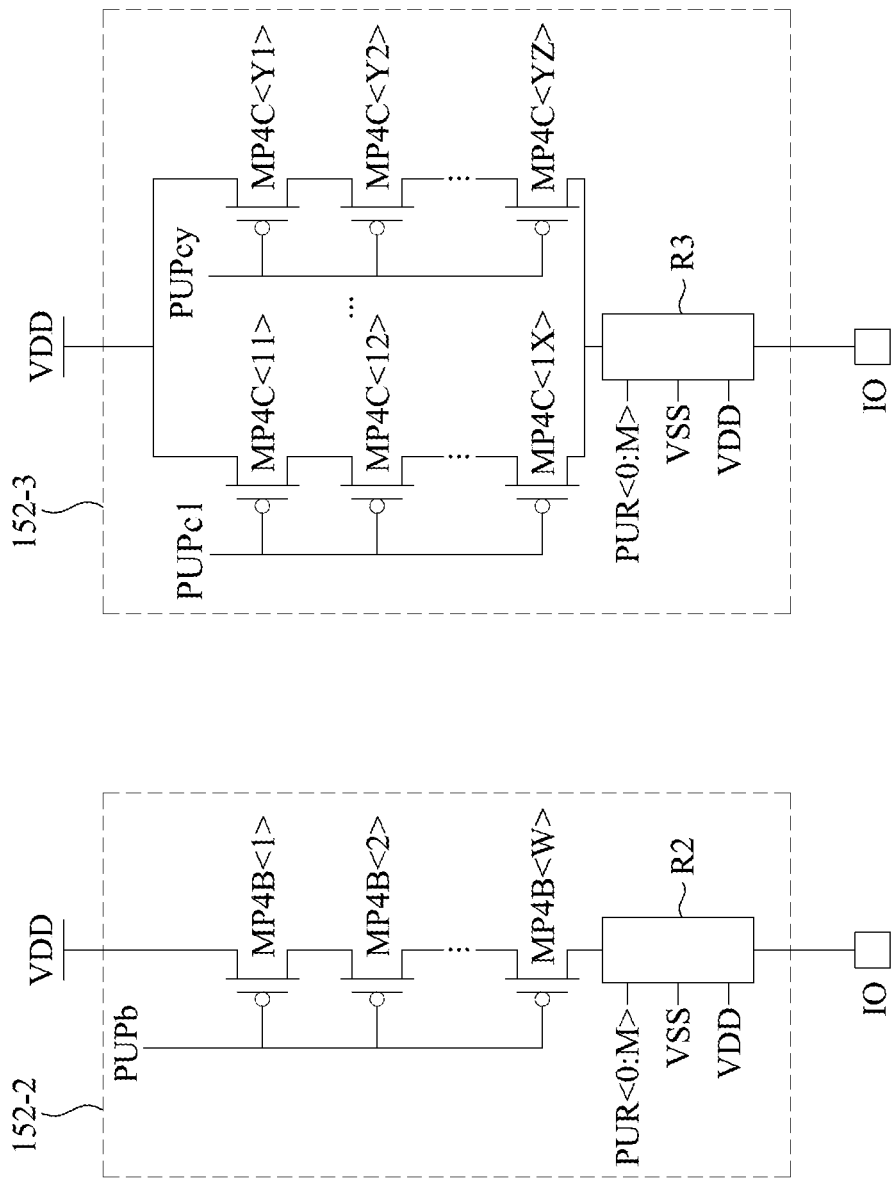
Figure 2A:
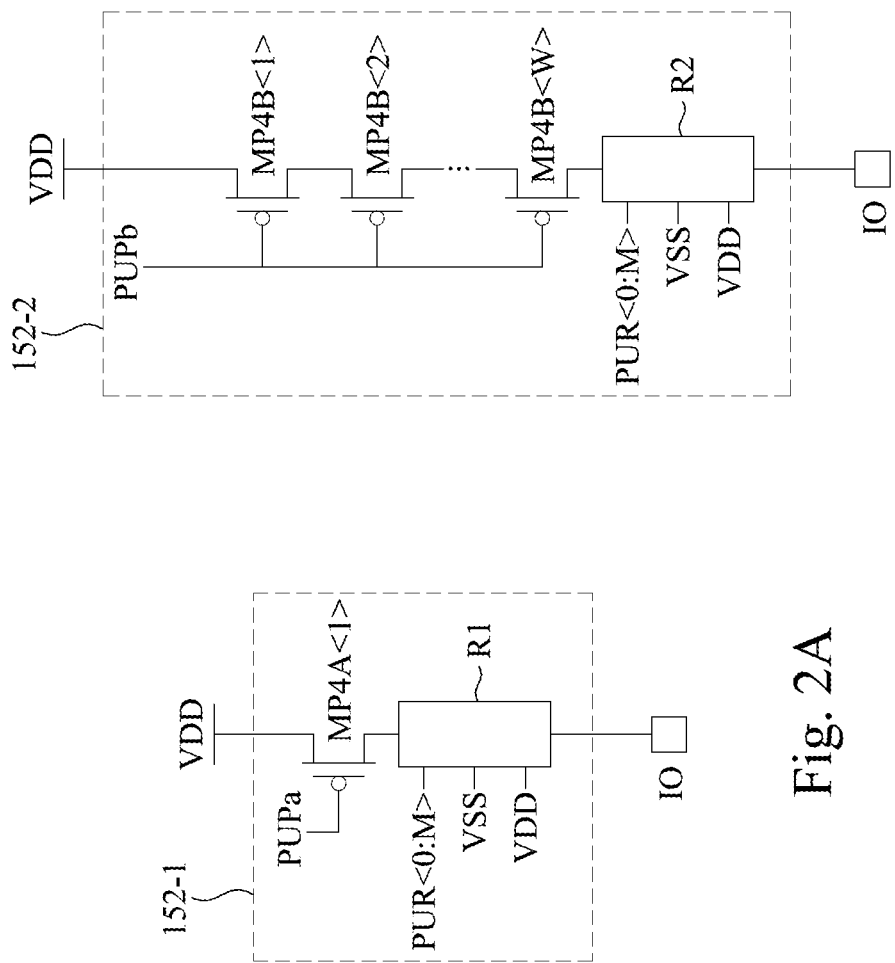

Reference is now made to FIGS. 2A-2C. FIGS. 2A-2C are schematic diagrams illustrating pull-up units 152-1 to 152-3 in accordance with some embodiments of the present disclosure. In some embodiments, the pull-up circuit 152 is implemented by the pull-up unit 152-1, the pull-up unit 152-2, the pull-up unit 152-3, or any combination of the pull-up units 152-1, 152-2 and/or 152-3.

For illustration, as shown in FIG. 2A, the pull-up unit 152-1 includes a PMOS transistor MP4A<1> and a resistance circuit R1. The PMOS transistor MP4A<1> and the resistance circuit R1 are connected in series between a power rail VDD (i.e., referred to as a voltage terminal providing a supply voltage VDD) and the input/output pad IO, in which the resistance circuit R1 is coupled between the PMOS transistor MP4A<1> and the input/output pad IO. A gate terminal of the PMOS transistor MP4A<1> is configured to receive a pull-up control signal PUPa (i.e., referred to as a gate signal), and accordingly the PMOS transistor MP4A<1> is controlled by the pull-up control signal PUPa. In some general cases, the pull-up control signal PUP illustrated in FIG. 1 includes the pull-up control signal PUPa illustrated in FIG. 2A. Moreover, the resistance circuit R1 is configured to receive the supply voltage VDD, a supply voltage VSS, and a resistance control signal PUR<0:M>. In some general cases, the resistance control signal PUR1 or PUR2 illustrated in FIG. 1 includes the resistance control signal PUR<0:M> illustrated in FIG. 2A.

In operation, when the data signal Data_IN is logic high, the PMOS transistor MP4A<1> is configured to be conducted according to the pull-up control signal PUPa in order to transmit the high voltage (i.e., the power rail VDD) to the input/output pad IO. Accordingly, the PMOS transistor MP4A<1> and the resistance circuit R1 form a charging path between the input/output pad IO and the power rail VDD.

With reference to FIG. 2B, for illustration, the pull-up unit 152-2 includes PMOS transistors MP4B<1> to MP4B<W> connected in series and a resistance circuit R2, in which W is a positive integer. The resistance circuit R2 is coupled between the PMOS transistors MP4B<1> to MP4B<W> and the input/output pad IO. The PMOS transistors MP4B<1> to MP4B<W> are controlled by a pull-up control signal PUPb. In some general cases, the pull-up control signal PUP illustrated in FIG. 1 includes the pull-up control signal PUPb illustrated in FIG. 2B. In some embodiments, the resistance circuit R2 is configured with respect to, for example, the resistance circuit R1 in FIG. 2A.

As shown in FIG. 2C, the pull-up unit 152-3 includes PMOS transistors MP4C<11> to MP4C<YZ> and a resistance circuit R3, in which X, Y and Z is positive integers. The resistance circuit R3 is coupled between the PMOS transistors MP4C<11> to MP4C<YZ> and the input/output pad IO. The PMOS transistors MP4C<11> to MP4C<1X> are controlled by a pull-up control signal PUPc1. The PMOS transistors MP4C<Y1> to MP4C<YZ> are controlled by another pull-up control signal PUPcy. Specifically, the pull-up unit 152-3 includes several series-connected PMOS transistors connected in parallel. In some embodiments, each series of the series-connected PMOS transistors has a different number of the PMOS transistors connected between the power rail VDD and the resistance circuit R3. In some general cases, the pull-up control signal PUP illustrated in FIG. 1 includes the pull-up control signals PUPc1 to PUPcy illustrated in FIG. 2C. In some embodiments, the resistance circuit R3 is configured with respect to, for example, the resistance circuit R1 in FIG. 2A.

In operation, each series of the PMOS transistors MP4C<11> to MP4C<YZ> forms different charging paths between the input/output pad IO and the power rail VDD. For example, PMOS transistors in different series are implemented with different dimensions. In some embodiments, the PMOS transistors MP4C<11> to MP4C<1X> allow a passing current larger than that passing the PMOS transistors MP4C<Y1> to MP4C<YZ>. Accordingly, when it is required to decrease a pull-up slew rate of the OCD driver circuit 150, only the PMOS transistors MP4C<Y1> to MP4C<YZ> are conducted by the pull-up control signal PUPcy while pulling up the input/output pad IO. When it is required to increase the pull-up slew rate of the OCD driver circuit 150, only the PMOS transistors MP4C<11> to MP4C<1X> are conducted by the pull-up control signal PUPc1 while pulling up the input/output pad IO. When it is required to maximize the pull-up slew rate of the OCD driver circuit 150, all PMOS transistors in the pull-up unit 152-3 are conducted in response to the pull-up control signals PUPc1 to PUPcy while pulling up the input/output pad IO. In some general cases, the pull-up control signals PUPc1 to PUPcy are determined according to the control signal OCD_CTRL corresponding to the PVT conditions of the off chip driver system 100. Accordingly, the pull-up circuit as illustrating in FIG. 2A is configured to, according to the pull-up control signal PUP, selectively activate at least one of charging paths between the power rail VDD and the input/output pad IO so as to provide the high voltage to the input/output pad IO.

The configurations of FIGS. 2A-2C are given for illustrative purposes. Various implements are within the contemplated scope of the present disclosure.

Figure 3:
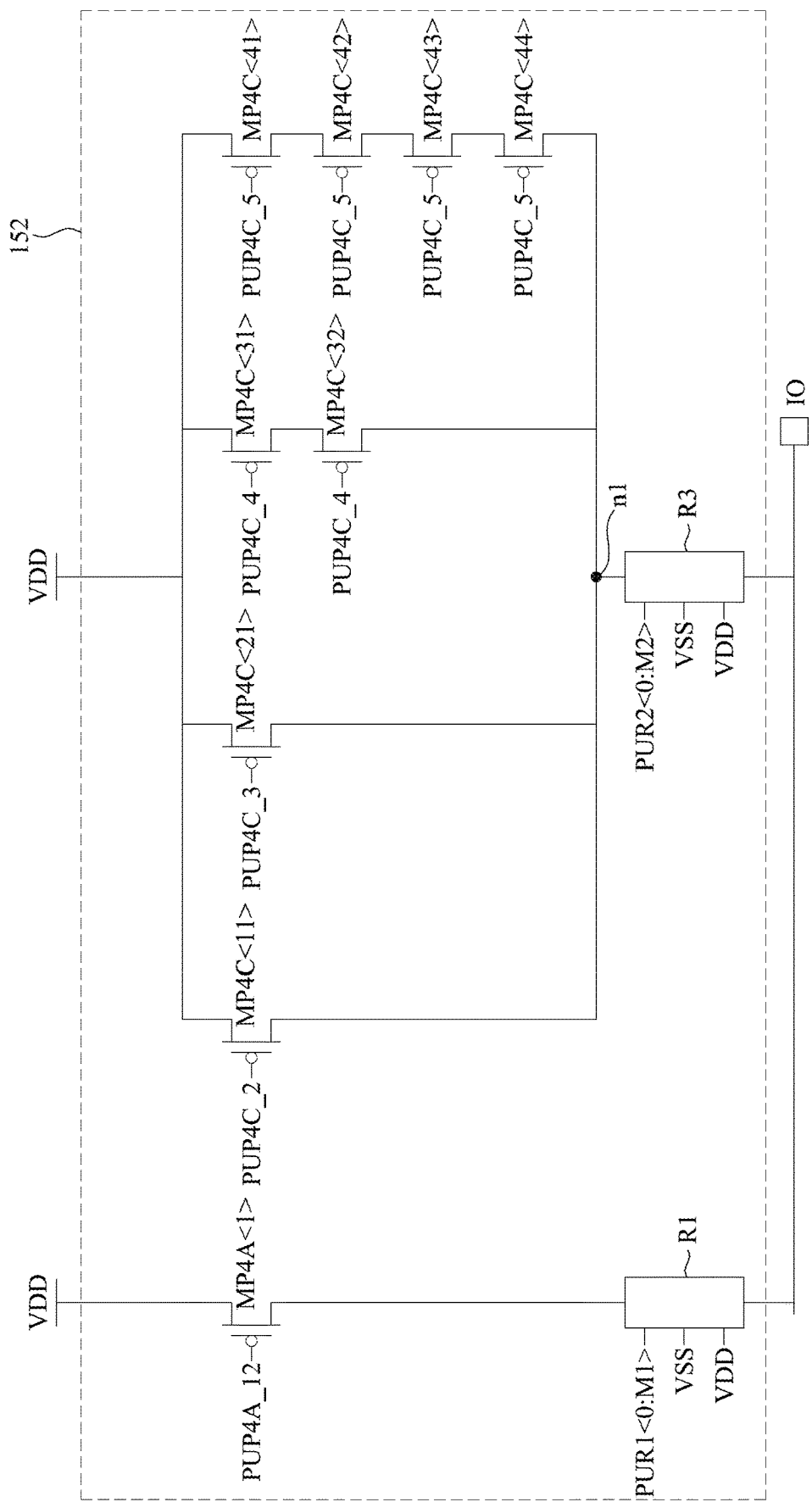
FIG. 3 is a schematic diagram illustrating a pull-up circuit in accordance with some embodiments of the present disclosure.

Reference is now made to FIG. 3. FIG. 3 is a schematic diagram illustrating the pull-up circuit 152 in accordance with some embodiments of the present disclosure. In some embodiments, the pull-up circuit 152 is implemented with the pull-up unit 152-1 illustrated in FIG. 2A and the pull-up unit 152-3 illustrated in FIG. 2C. Similarly, the resistance circuit R1 is connected between the PMOS transistor MP4A<1> and the input/output pad IO, and a gate terminal of the PMOS transistor MP4A<1> is configured to receive a pull-up control signal PUP4A_12. The pull-up circuit 152 in FIG. 3 includes the PMOS transistor MP4A<1>, the PMOS transistor MP4C<11>, the PMOS transistor MP4C<21>, the series-coupled PMOS transistors MP4C<31> to MP4C<32>, and the series-coupled PMOS transistors MP4C<41> to MP4C<44>. A gate terminal of the PMOS transistor MP4C<11> is configured to receive a pull-up control signal PUP4C_2. A gate terminal of the PMOS transistor MP4C<21> is configured to receive a pull-up control signal PUP4C_3. Each of gate terminals of the PMOS transistors MP4C<31> to MP4C<32> is configured to receive a pull-up control signals PUP4C_4. Each of gate terminals of the PMOS transistors MP4C<41> to MP4C<44> is configured to receive a pull-up control signal PUP4C_5. In some embodiments, the pull-up control signal PUP illustrated in FIG. 1 includes the pull-up control signals PUP4A_12, PUP4C_2, PUP4C_3, PUP4C_4, and PUP4C_5.

Figure 4:
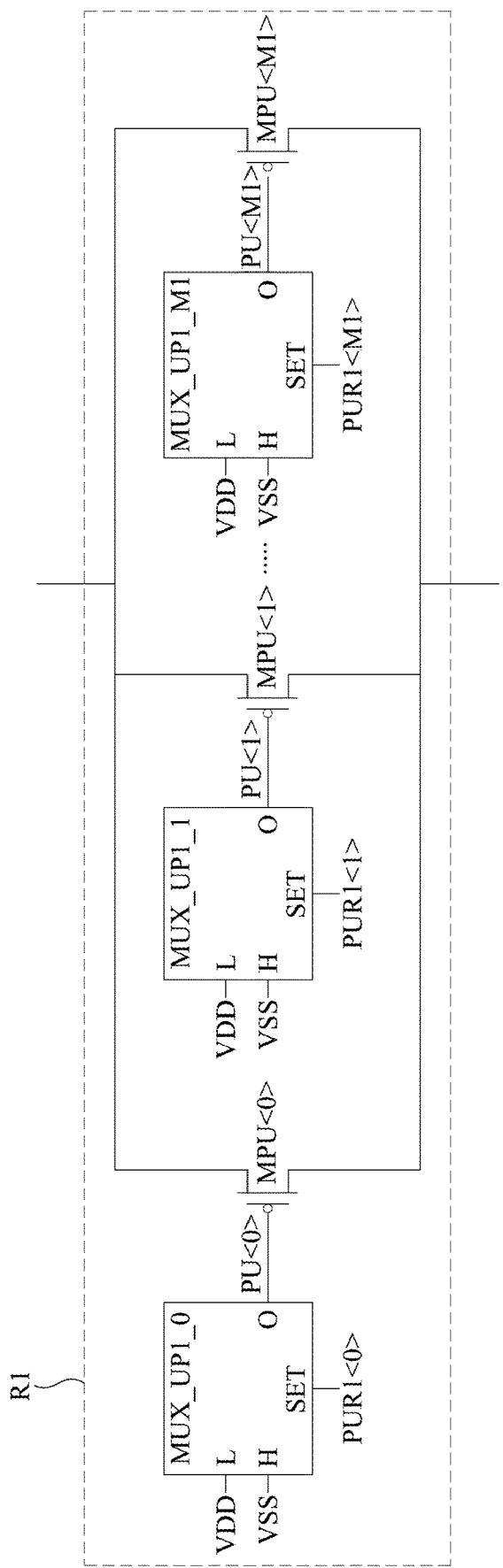
FIG. 4 is a schematic diagram illustrating a resistance circuit in accordance with some embodiments of the present disclosure.

Reference is now made to FIG. 4. FIG. 4 is a schematic diagram illustrating the resistance circuit R1 in accordance with some embodiments of the present disclosure. For illustration, the resistance circuit R1 includes (M1+1) PMOS transistors MPU<0> to MPU<M1>, in which M1 is a positive integer. The PMOS transistors MPU<0> to MPU<M1> are coupled in parallel between the input/output pad and the PMOS transistor MP4A<1>.

The resistance circuit R1 also includes several multiplexer circuits MUX_UP1_0-MUX_UP1_M1. Each of the multiplexer circuits MUX_UP1_0-MUX_UP1_M1 is configured to receive the supply voltages VDD and VSS and to generate, in response to the resistance control signal PUR1<0:M1>, a resistance control signal (i.e., one of resistance control signals PU<0> to PU<M1>) to a corresponding one of the PMOS transistors MPU<0> to MPU<M1> for selectively turned on the transistor. Specifically, as shown in FIG. 4, when a bit PUR1<0>, a first bit of the resistance control signal PUR1<0:M1>, input into a select pin SEL of the multiplexer circuit MUX_UP1_0 is a high logic state (i.e., a logic "1"), the multiplexer circuit MUX_UP1_0 outputs the supply voltage VSS to generate the resistance control signal PU<0> having a low logic state (i.e., a logic "0".) Accordingly, the PMOS transistor MPU<0> is turned on. By contrast, when the bit PUR1<0> is the low logic state (i.e., the logic "0"), the multiplexer circuit MUX_UP1_0 outputs the supply voltage VDD to generate the resistance control signal PU<0> having the high logic state (i.e., the logic "1".) Accordingly, the PMOS transistor MPU<0> is turned off.

Based on the above, as a number of the turned-on PMOS transistors in the resistance circuit R1 increases, an equivalent resistance of the resistance circuit R1 drops. By contrast, as the number of the turned-on PMOS transistors in the resistance circuit R1 declines, the equivalent resistance of the resistance circuit R1 rises correspondingly. Alternatively stated, a resistance of the resistance circuit R1 is variable in accordance with the number of the turned-on PMOS in the resistance circuit R1. Accordingly, the resistance circuit R1 has a variable resistance according to the resistance control signal PUR1<0:M1>. In some embodiments, the resistance circuit R1 is referred to as an adjustable pull up MOS resistor (APUMR) operating as an active component in the pull-up circuit 152.

In some embodiments, the resistance circuit R3 includes PMOS transistors (i.e., not shown, referred to as transistors MPU<0> to MPU<M2>, in which M2 is a positive integer.) and multiplexer circuits MUX_UP2_0-MUX_UP2_M2. In various embodiments, numbers M1 and M2 are different from each other. The configurations of the resistance circuit R3 in FIG. 3 are similar to that of the resistance circuit R1. Accordingly, the repetitious descriptions are omitted here.

Reference is now made to FIGS. 3-4 together. In operation, the PMOS transistors MP4A<1>, MP4C<11>, MP4C<21>, MP4C<31> to MP4C<32>, and MP4C<41> to MP4C<44> are configured to generate the supply voltage VDD to a node n1 and a terminal of the resistance circuit R1, in which the PMOS transistors MP4A<1>, MP4C<11>, MP4C<21>, MP4C<31> to MP4C<32>, and MP4C<41> to MP4C<44> couple with the resistance circuit R3 at the node n1, as shown in FIG. 3. The resistance circuit R1 is configured to transmit, in response to the resistance control signal PUR2<0:M1>, the supply voltage VDD to the input/output pad, and the resistance circuit R3 is configured to transmit, in response to the resistance control signal PUR2<0:M2>, the supply voltage VDD received at the node n1 to the input/output pad. Accordingly, a voltage level of the input/output pad is pulled up by the pull-up circuit 152. Numbers M1 and M2 are integer. In some embodiments, the numbers M1 and M2 are different from each other. Alternatively stated, the number of the PMOS transistors in the resistance circuit R1 is different from that in the resistance circuit R3. In alternative embodiment, the number of the PMOS transistors in the resistance circuits R1 and R3 is the same.

For example, in some embodiments, when at least one of the PMOS transistors MP4A<1>, MP4C<11>, MP4C<21>, MP4C<31> to MP4C<32>, and MP4C<41> to MP4C<44> is turned on, at least one of the PMOS transistors MPU<0> to MPU<M1> in the resistance circuit R1 is turned on, in response to the resistance control signal PUR1<0:M1>, and/or at least one of the PMOS transistors MPU<0> to MPU<M1> in the resistance circuit R3 is turned on, in response to the resistance control signal PUR2<0:M2>, to transmit the supply voltage VDD to the input/output pad IO. Accordingly, the input/output pad IO is charged.

Based on the above, when the input/output pad IO is charged, the charging paths relative to the input/output pad IO is started from the input/output pad IO, through the resistance circuit(s) (e.g., the resistance circuit R1 and/or R3), the active component MOSFET (e.g., the PMOS transistor MP4A<1>, MP4C<11>, MP4C<21>, MP4C<31> to MP4C<32>, MP4C<41> to MP4C<44>, or the combination thereof) and then to the power rail VDD. In the OCD structure illustrated in FIG. 3, the active loads (e.g. the resistance circuits R1 and R3) are directly coupled with the input/output pad IO.

In some embodiments, the total loading includes the external loading (induced by the external components connected with the input/output pad IO) and the internal loading (induced by the internal components within the OCD driver circuit 150). As shown in FIG. 3, the total loading includes capacitance between gates, drains and sources of a first group of active components MOSFET (Cgd and Cdb of PMOS transistors in the resistance circuits R1, R3, or the combination thereof), gates, drains and sources of a second group of active components MOSFET (Cgd and Cdb of MP4A<1>, MP4C<11>, MP4C<21>, MP4C<31> to MP4C<32>, MP4C<41> to MP4C<44>, or the combination thereof), and the external loading (not shown in figures). With the configurations of the present disclosure, the signal transmitted through the input/output pad is firstly affected by the loading effect induced by the first group of active components MOSFET and then that induced by the second group of active components MOSFET, in which the loading effect caused by the second group of active components MOSFET is significantly decayed and smaller than that caused by the first group of active components MOSFET. In some embodiments, it will induce a smaller loading effect on the input/output pad IO, compared with some approaches which utilize passive resistive loads as the resistance circuits R1, R3 shown in FIG. 3. In those approaches, while pulling up the voltage level on the input/output pad IO, it is required to overcome the loading effect induced by these passive resistive loads and an external load coupled with the input/output pad IO. The too large loading effect will cause signals distorted and attenuated in high speed data transmission as the operation frequency becomes faster and faster.

It should be noted that the pull-up circuit 152 is given merely as an example, and not intended to limit the present disclosure. Any circuit that implements the pull-up circuit, in which the resistance circuit is coupled between the input/output pad and the active component MOSFET, is within the scope of the present disclosure. That is, the design of the pull-up circuit 152 may be adjusted by those of ordinary skills in the art.

Figure 5C:
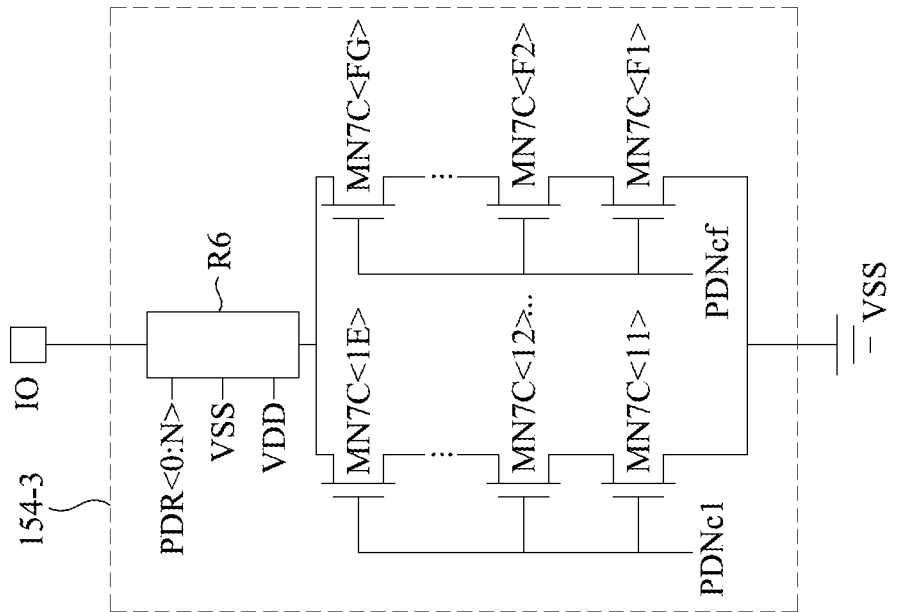
FIGS. 5A-5C are schematic diagrams illustrating pull-down units in accordance with some embodiments of the present disclosure.
Figure 5B:
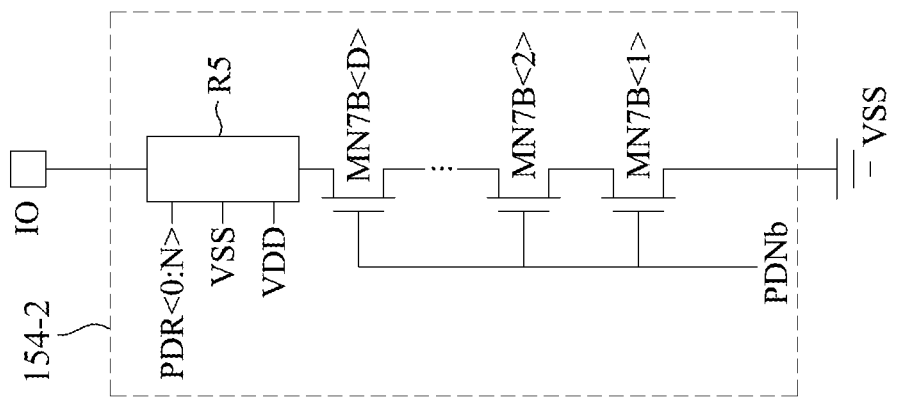
Figure 5A:
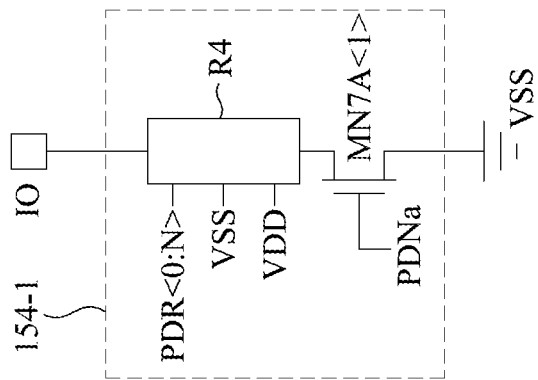

Reference is now made to FIGS. 5A-5C. FIGS. 5A-5C are schematic diagrams illustrating pull-down units 154-1 to 154-3 in accordance with some embodiments of the present disclosure. In some embodiments, the pull-down circuit 154 is implemented by the pull-down unit 154-1, the pull-down unit 154-2, the pull-down unit 154-3, or any combination of the pull-down units 154-1, 154-2 and/or 154-3.

For illustration, as shown in FIG. 5A, the pull-down unit 154-1 includes a NMOS transistor RMN7A<1> and a resistance circuit R4. The NMOS transistor RMN7A<1> and the resistance circuit R4 are connected in series between a power rail VSS (i.e., referred to as a voltage terminal providing a supply voltage VSS) and the input/output pad IO, in which the resistance circuit R4 is coupled between the NMOS transistor RMN7A<1> and the input/output pad IO. A gate terminal of the NMOS transistor RMN7A<1> is configured to receive a pull-down control signal PDNa (i.e., referred to as a gate signal), and accordingly the NMOS transistor RMN7A<1> is controlled by the pull-down control signal PDNa. In some general cases, the pull-down control signal PDN illustrated in FIG. 1 includes the pull-down control signal PDNa illustrated in FIG. 5A. Moreover, the resistance circuit R4 is configured to receive the supply voltage VSS, the supply voltage VDD, and a resistance control signal PDR<0:N>. In some general cases, the resistance control signals PDR1 or PDR2 illustrated in FIG. 1 includes the resistance control signal PDR<0:N> illustrated in FIG. 5A.

In operation, when the data signal Data_IN is logic low, the NMOS transistor RMN7A<1> is configured to be conducted according to the pull-down control signal PDNa in order to transmit the low voltage (i.e., the power rail VSS) to the input/output pad IO. Accordingly, the NMOS transistor RMN7A<1> and the resistance circuit R4 form a charging path between the input/output pad IO and the power rail VSS.

With reference to FIG. 5B, for illustration, the pull-down unit 154-2 includes NMOS transistors MN7B<1> to MN7B<D> connected in series and a resistance circuit R5, in which D is a positive integer. The resistance circuit R5 is coupled between the NMOS transistors MN7B<1> to MN7B<D> and the input/output pad IO. The NMOS transistors MN7B<1> to MN7B<D> are controlled by a pull-down control signal PDNb. In some general cases, the pull-down control signal PDN illustrated in FIG. 1 includes the pull-down control signal PDNb illustrated in FIG. 5B. In some embodiments, the resistance circuit R5 is configured with respect to, for example, the resistance circuit R4 in FIG. 5A.

As shown in FIG. 5C, the pull-down unit 154-3 includes NMOS transistors MN7C<11> to MN7C<FG> and a resistance circuit R6, in which E, F and G is positive integers. The resistance circuit R6 is coupled between the NMOS transistors MN7C<11> to MN7C<FG> and the input/output pad IO. The NMOS transistors MN7C<11> to MN7C<1E> are controlled by a pull-down control signal PDNc1. The NMOS transistors MN7C<F1> to MN7C<FG> are controlled by another pull-down control signal PDNcf. Specifically, the pull-down unit 154-3 includes several series-connected NMOS transistors connected in parallel. In some embodiments, each series of the series-connected NMOS transistors has a different number of the NMOS transistors connected between the power rail VSS and the resistance circuit R6. In some general cases, the pull-down control signals PDN illustrated in FIG. 1 includes the pull-down control signals PDNc1 to PDNcf illustrated in FIG. 5C. In some embodiments, the resistance circuit R6 is configured with respect to, for example, the resistance circuit R4 in FIG. 5A.

In operation, each series of the NMOS transistors MN7C<11> to MN7C<FG> forms different charging paths between the input/output pad IO and the power rail VSS. For example, NMOS transistors in different series are implemented with different dimensions. In some embodiments, the NMOS transistors MN7C<11> to MN7C<1E> allow a passing current larger than that passing the NMOS transistors MN7C<F1> to MN7C<FG>. Accordingly, when it is required to decrease a pull-down slew rate of the OCD driver circuit 150, only the NMOS transistors MN7C<F1> to MN7C<FG> are conducted by the pull-down control signal PDNcf while pulling up the input/output pad IO. When it is required to increase the pull-down slew rate of the OCD driver circuit 150, only the NMOS transistors MN7C<11> to MN7C<1E> are conducted by the pull-down control signal PDNc1 while pulling down the input/output pad IO. When it is required to maximize the pull-down slew rate of the OCD driver circuit 150, all NMOS transistors in the pull-down unit 154-3 are conducted in response to the pull-down control signals PDNc1 to PDNcf while pulling down the input/output pad IO. In some general cases, the pull-down control signals PDNc1 to PDNcf are determined according to the control signal OCD_CTRL corresponding to the PVT conditions of the off chip driver system 100. Accordingly, the pull-down circuit as illustrating in FIG. 5A is configured to, according to the pull-down control signal PDN, selectively activate at least one of charging paths between the power rail VSS and the input/output pad IO so as to provide the low voltage to the input/output pad IO.

The configurations of FIGS. 5A-5C are given for illustrative purposes. Various implements are within the contemplated scope of the present disclosure.

Figure 6:
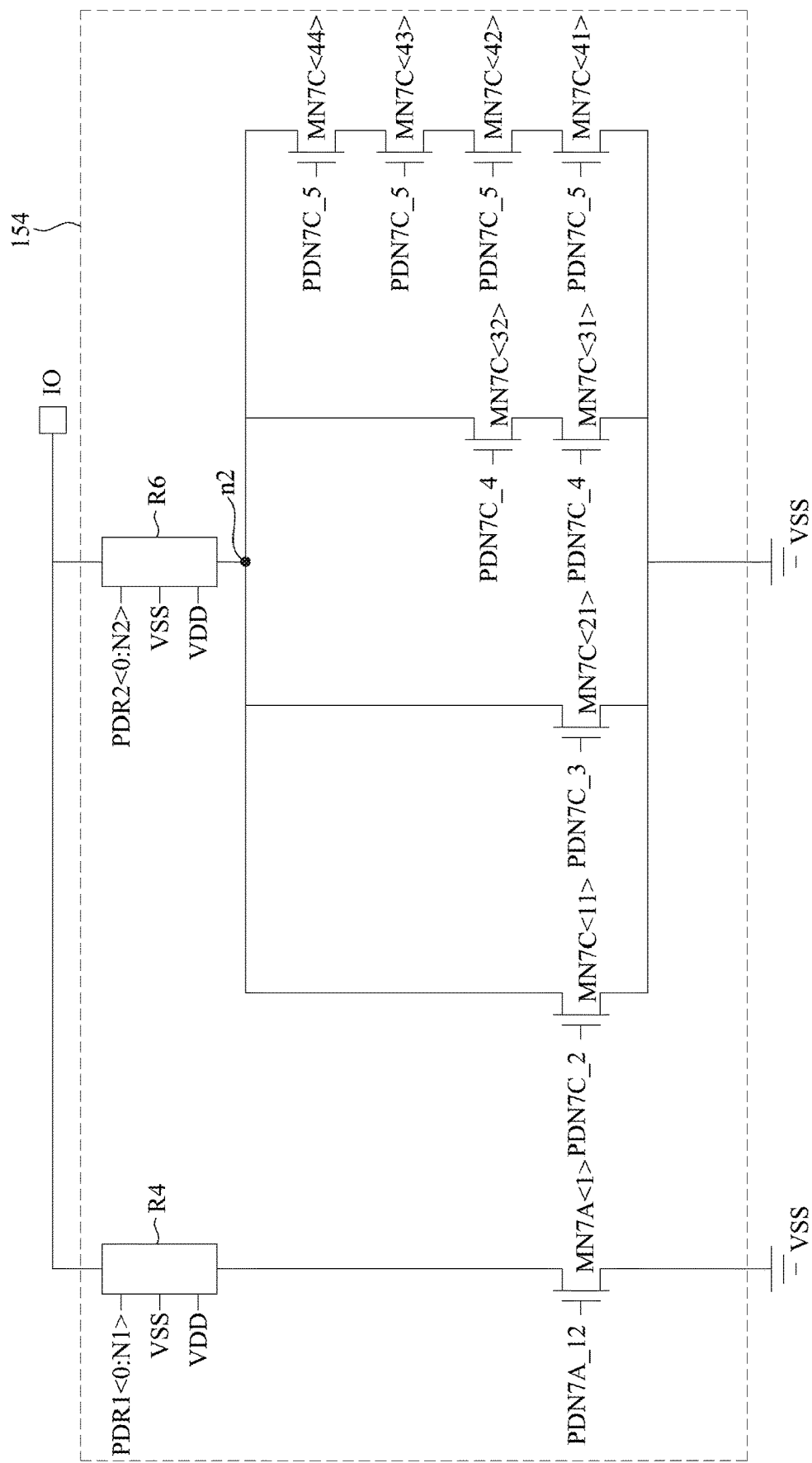
FIG. 6 is a schematic diagram illustrating a pull-down circuit in accordance with some embodiments of the present disclosure.

Reference is now made to FIG. 6. FIG. 6 is a schematic diagram illustrating the pull-down circuit 154 in accordance with some embodiments of the present disclosure. In some embodiments, the pull-down circuit 154 is implemented with the pull-down unit 154-1 illustrated in FIG. 5A and the pull-down unit 154-3 illustrated in FIG. 5C. Similarly, the resistance circuit R4 is connected between the NMOS transistor RMN7A<1> and the input/output pad IO, and a gate terminal of the NMOS transistor RMN7A<1> is configured to receive a pull-down control signal PDN7A_12. The pull-down circuit 154 in FIG. 6 includes the NMOS transistor RMN7A<1>, the NMOS transistor MN7C<11>, the NMOS transistor MN7C<21>, the series-coupled NMOS transistors MN7C<31> to MN7C<32>, and the series-coupled NMOS transistors MN7C<41> to MN7C<44>. A gate terminal of the NMOS transistor MN7C<11> is configured to receive a pull-down control signal PDN7C_2. A gate terminal of the NMOS transistor MN7C<21> is configured to receive a pull-down control signal PDN7C_3. Each of gate terminals of the NMOS transistors MN7C<31> to MN7C<32> is configured to receive a pull-up control signals PDN7C_4. Each of gate terminals of the NMOS transistors MN7C<41> to MN7C<44> is configured to receive a pull-down control signal PDN7C_5. In some embodiments, the pull-down control signal PDN illustrated in FIG. 1 includes the pull-down control signals PDN7A_12, PDN7C_2, PDN7C_3, PDN7C_4, and PDN7C_5.

Figure 7:
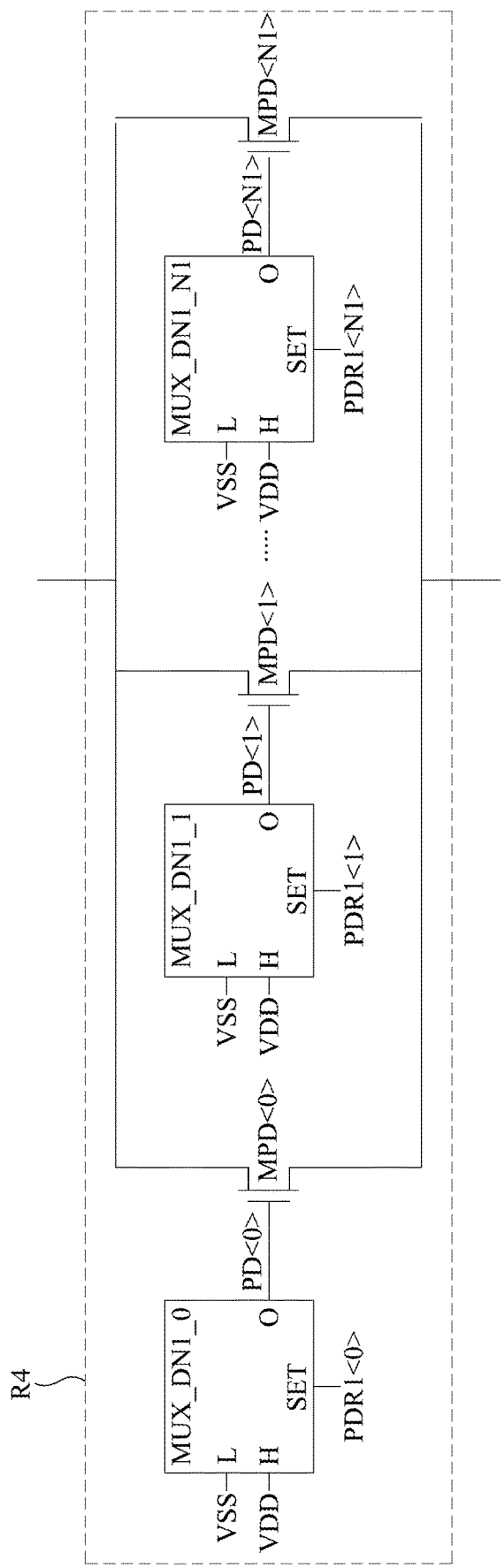
FIG. 7 is a schematic diagram illustrating a resistance circuit in accordance with some embodiments of the present disclosure.

Reference is now made to FIG. 7. FIG. 7 is a schematic diagram illustrating the resistance circuit R4 in accordance with some embodiments of the present disclosure. For illustration, the resistance circuit R4 includes (N1+1) NMOS transistors MPD<0> to MPD<N1>, in which N1 is a positive integer. The NMOS transistors MPD<0> to MPD<N1> are coupled in parallel between the input/output pad and the NMOS transistor RMN7A<1>.

The resistance circuit R4 also includes several multiplexer circuits MUX_DN1_0-MUX_DN1_N1. Each of the multiplexer circuits MUX_DN1_0-MUX_DN1_N1 is configured to receive the supply voltages VSS and VDD and to generate, in response to the resistance control signal PDR1<0:N1>, a resistance control signal (i.e., one of resistance control signals PD<0> to PD<N1>) to a corresponding one of the NMOS transistors MPD<0> to MPD<N1> for selectively turned on the transistor. Specifically, as shown in FIG. 7, when a bit PDR1<0>, a first bit of the resistance control signal PDR1<0:N1>, input into a select pin SEL of the multiplexer circuit MUX_DN1_0 is the high logic state (i.e., the logic "1"), the multiplexer circuit MUX_DN1_0 outputs the supply voltage VDD to generate the resistance control signal PD<0> having the high logic state (i.e., the logic "1".) Accordingly, the NMOS transistor MPD<0> is turned on. By contrast, when the bit PDR1<0> is the low logic state (i.e., the logic "0"), the multiplexer circuit MUX_DN1_0 outputs the supply voltage VSS to generate the resistance control signal PD<0> having the low logic state (i.e., the logic "0".) Accordingly, the NMOS transistor MPD<0> is turned off.

Based on the above, as a number of the turned-on NMOS transistors in the resistance circuit R4 increases, an equivalent resistance of the resistance circuit R4 drops. By contrast, as the number of the turned-on NMOS transistors in the resistance circuit R4 declines, the equivalent resistance of the resistance circuit R4 rises correspondingly. Alternatively stated, a resistance of the resistance circuit R4 is variable in accordance with the number of the turned-on NMOS in the resistance circuit R4. Accordingly, the resistance circuit R4 has a variable resistance according to the resistance control signal PDR1<0:N1>. In some embodiments, the resistance circuit R4 is referred to as an adjustable pull down MOS resistor (APDMR) operating as an active component in the pull-down circuit 154.

In some embodiments, the resistance circuit R6 includes NMOS transistors (i.e., not shown, referred to as transistors MPD<0> to MPU<N2>, in which N2 is a positive integer.) and multiplexer circuits MUX_DN2_0-MUX_DN2_N2. In various embodiments, numbers N1 and N2 are different from each other. The configurations of the resistance circuit R6 in FIG. 6 are similar to that of the resistance circuit R4. Accordingly, the repetitious descriptions are omitted here.

Reference is now made to FIGS. 6-7 together. In operation, the NMOS transistors RMN7A<1>, MN7C<11>, MN7C<21>, MN7C<31> to MN7C<32>, and MN7C<41> to MN7C<44> are configured to generate the supply voltage VSS to a node n2 and a terminal of the resistance circuit R4, in which the NMOS transistors RMN7A<1>,MN7C<11>, MN7C<21>, MN7C<31> to MN7C<32>, and MN7C<41> to MN7C<44> couple with the resistance circuit R6 at the node n2, as shown in FIG. 6. The resistance circuit R4 is configured to transmit, in response to the resistance control signal PDR1<0:N1>, the supply voltage VSS to the input/output pad, and the resistance circuit R6 is configured to transmit, in response to the resistance control signal PDR2<0:N2>, the supply voltage VSS received at the node n2 to the input/output pad. Accordingly, a voltage level of the input/output pad is pulled down by the pull-down circuit 154. Numbers N1 and N2 are integer. In some embodiments, the numbers N1 and N2 are different from each other. Alternatively stated, the number of the NMOS transistors in the resistance circuit R4 is different from that in the resistance circuit R6. In alternative embodiment, the number of the NMOS transistors in the resistance circuits R4 and R6 is the same.

For example, in some embodiments, when at least one of the NMOS transistors RMN7A<1>, MN7C<11>, MN7C<21>, MN7C<31> to MN7C<32>, and MN7C<41> to MN7C<44> is turned on, at least one of the NMOS transistors MPD<0> to MPD<N1> in the resistance circuit R4 is turned on, in response to the resistance control signal PDR1<0:N1>, and/or at least one of the NMOS transistors MPD<0> to MPD<N1> in the resistance circuit R6 is turned on, in response to the resistance control signal PDR2<0:N2>, to transmit the supply voltage VSS to the input/output pad IO. Accordingly, the input/output pad IO is discharged.

Based on the above, when the input/output pad IO is discharged, the discharging paths relative to the input/output pad IO is started from the input/output pad IO, through the resistance circuit(s) (e.g., the resistance circuit R4 and/or R6), the active component MOSFET (e.g., the NMOS transistor RMN7A<1>, MN7C<11>, MN7C<21>, MN7C<31> to MN7C<32>, MN7C<41> to MN7C<44>, or the combination thereof) and then to the power rail VSS. In the OCD structure illustrated in FIG. 6, the active loads (e.g. the resistance circuits R4 and R6) are directly coupled with the input/output pad IO.

As shown in FIG. 6, the total loading includes capacitance between gates, drains and sources of a first group of active components MOSFET (Cgd and Cdb of NMOS transistors in the resistance circuits R4, R6, or the combination thereof), gates, drains and sources of a second group of active components MOSFET (Cgd and Cdb of RMN7A<1>, MN7C<11>, MN7C<21>, MN7C<31> to MN7C<32>, MN7C<41> to MN7C<44>, or the combination thereof), and the external loading (not shown in figures). With the configurations of the present disclosure, the signal transmitted through the input/output pad is firstly affected by the loading effect induced by the first group of active components MOSFET and then that induced by the second group of active components MOSFET, in which the loading effect caused by the second group of active components MOSFET is significantly decayed and smaller than that caused by the first group of active components MOSFET. In some embodiments, it will induce a smaller loading effect on the input/output pad IO, compared with some approaches which utilize passive resistive loads as the resistance circuits R4, R6 shown in FIG. 6. In those approaches, while pulling down the voltage level on the input/output pad IO, it is required to overcome the loading effect induced by these passive resistive loads and an external load coupled with the input/output pad IO. The too large loading effect will cause signals distorted and attenuated in high speed data transmission as the operation frequency becomes faster and faster.

It should be noted that the pull-down circuit 154 is given merely as an example, and not intended to limit the present disclosure. Any circuit that implements the pull-down circuit, in which the resistance circuit is coupled between the input/output pad and the active component MOSFET, is within the scope of the present disclosure. That is, the design of the pull-down circuit 154 may be adjusted by those of ordinary skills in the art.

Figure 8:
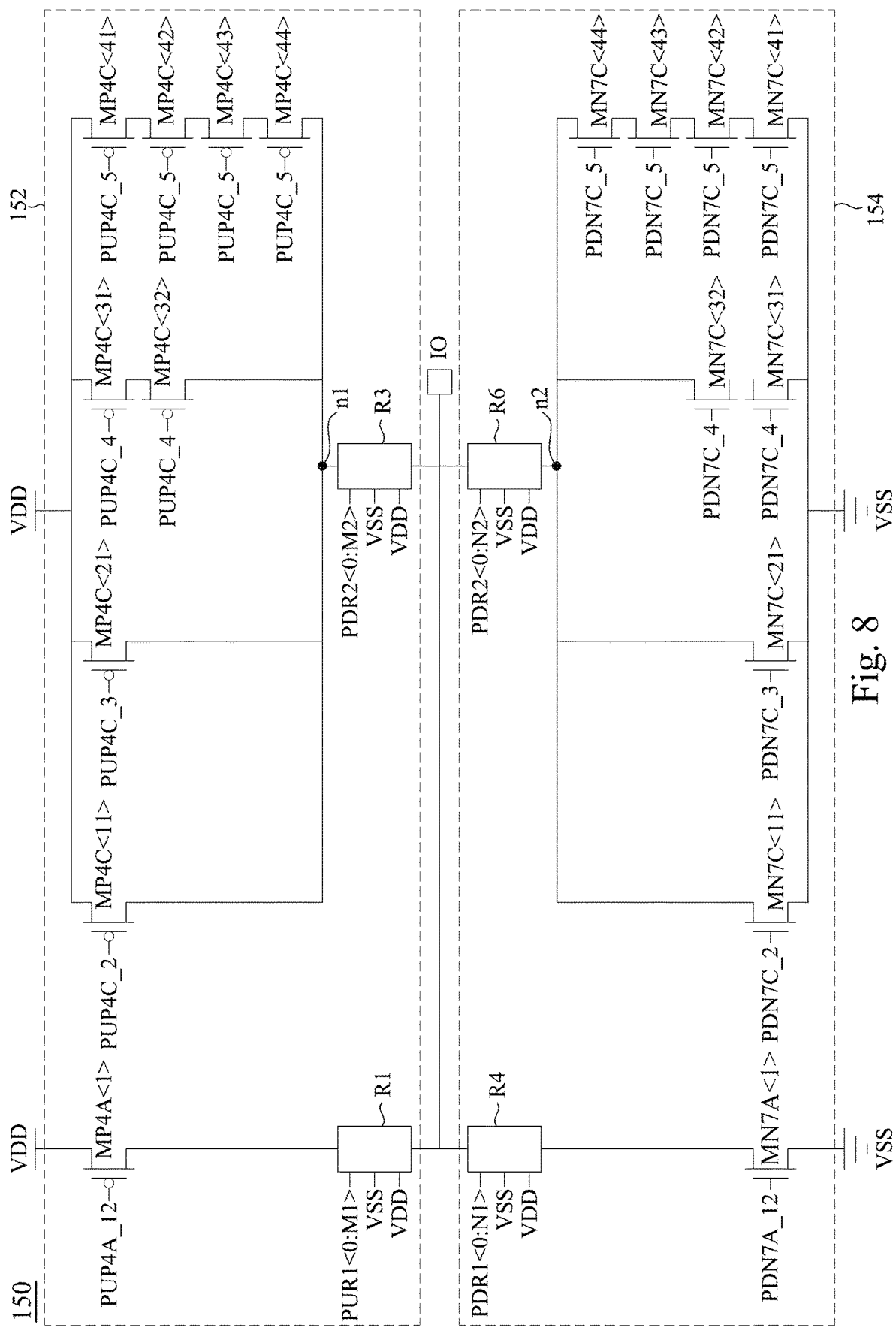
FIG. 8 is a schematic diagram illustrating an off chip driver circuit in accordance with some embodiments of the present disclosure.

Reference is now made to FIG. 8. FIG. 8 is a schematic diagram illustrating the off chip driver (OCD) circuit 150 corresponding to that in FIG. 1 in accordance with some embodiments of the present disclosure. The OCD driver circuit 150 in FIG. 8 is an embodiment of the OCD driver circuit 150 shown in FIG. 1. The OCD driver circuit 150 includes the pull-up circuit 152 as illustrated in FIG. 3 and the pull-down circuit 154 as illustrated in FIG. 6.

In operation, when the data signal Data_IN is logic high, at least one of the PMOS transistors MP4A<1>, MP4C<11>, MP4C<21>, MP4C<31> to MP4C<32>, and MP4C<41> to MP4C<44> is turned on in response to at least one of the pull-up control signals PUP4A_12, PUP4C_2-PUP4C_5 having logic low and at least one PMOS transistor of in the resistance circuits R1 and R3 in response to the resistance control signal PUR1<0:M1> and/or PUR2<0:M2>. Accordingly, the at least one of the charging path is activated in order to provide the high voltage (e.g., VDD) to the input/output pad IO. In the meantime, all NMOS transistors in the pull-down circuit 154 are turned off.

On the other hand, when the data signal Data_IN is logic low, at least one of the NMOS transistors RMN7A<1>, MN7C<11>, MN7C<21>, MN7C<31> to MN7C<32>, and MN7C<41> to MN7C<44> is turned on in response to at least one of the pull-down control signals PDN7A_12, PDN7C_2-PDN7C_5 having logic high and at least one NMOS transistor of in the resistance circuits R4 and R6 in response to the resistance control signal PDR1<0:N1> and/or PDR2<0:N2>. Accordingly, the at least one of the discharging path is activated in order to provide the low voltage (e.g., VSS or a ground) to the input/output pad IO.

In some embodiments, an amount of PMOS transistors included the pull-up circuit 152 is different from an amount of NMOS transistors included in the pull-down circuit 154. In various embodiments, an amount of PMOS transistors included the resistance circuit R1 is different from an amount of NMOS transistors included in the resistance circuit R4. In yet alternative embodiment, an amount of PMOS transistors included the resistance circuit R3 is different from an amount of NMOS transistors included in the resistance circuit R6.

Figure 9:
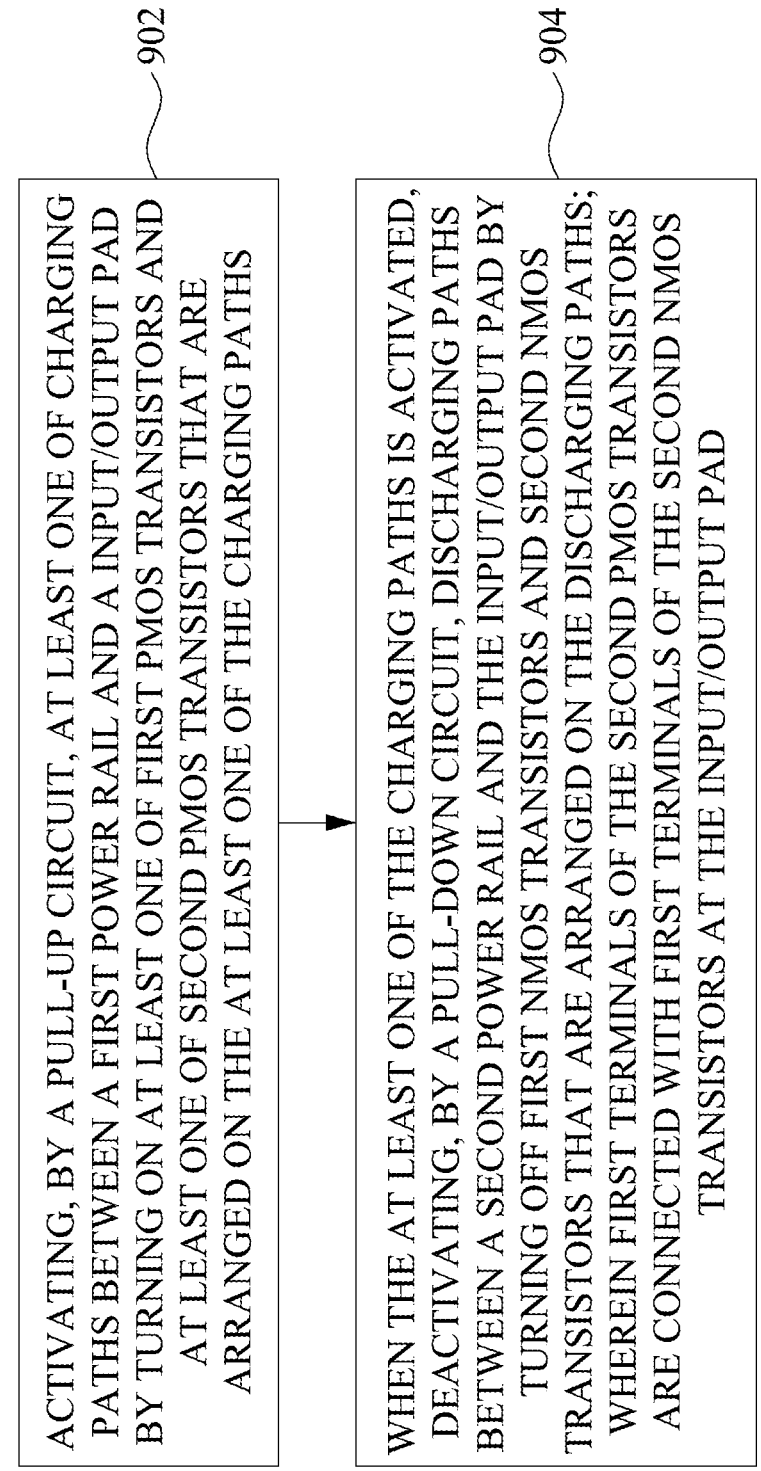
FIG. 9 is a flow chart of a method for operating an off chip driver circuit in accordance with some embodiments of the present disclosure.

FIG. 9 is a flow chart of a method 900 for operating an off chip driver circuit in accordance with some embodiments of the present disclosure. For ease of understanding, the method 900 is described with reference to FIG. 3, FIG. 6 and FIG. 8. However, the method 900 is not limited to being applied to generate the above layout structures. The method 900 is able to be applied to generate any suitable layout structure. For illustration in FIG. 9, the method 900 includes operations 902 and 904, which will be discussed in detail below.

In operation 902, as shown in FIG. 8, the pull-up circuit 152 activates at least one of the charging paths between the power rail VDD and the input/output pad IO by turning on at least one of PMOS transistors MP4A<1>, MP4C<11>, MP4C<21>, MP4C<31> to MP4C<32>, and MP4C<41> to MP4C<44> and at least one of the PMOS transistors MPU<0> to MPU<M1> in the resistance circuit R1 and MPU<0> to MPU<M2> in the resistance circuit R3 that are arranged on the at least one the charging paths.

In some embodiments, the activating the at least one charging path also includes operations of generating, by one of the multiplexer circuits MUX_UP1_0-MUX_UP1_M1 and MUX_UP2_0-MUX_UP2_M2, a resistance control signal (i.e., one of the resistance control signals PU<0> to PU<M1> and PU<0> to PU<M2>) to turn on the at least one of PMOS transistors MPU<0> to MPU<M1> in the resistance circuit R1 and MPU<0> to MPU<M2> in the resistance circuit R3 in response to a resistance control signal (i.e., the resistance control signal PUR1<0:M1> or PUR1<0:M2>).

In operation 904, as shown in FIG. 8, when the at least one of the charging paths is activated, the pull-down circuit 154 deactivates the discharging paths between the power rail VSS, different from the power rail VDD, and the input/output pad IO by turning off the NMOS transistors RMN7A<1>, MN7C<11>, MN7C<21>, MN7C<31> to MN7C<32>, and MN7C<41> to MN7C<44> and the NMOS transistors MPD<0> to MPD<N1> in the resistance circuit R4 and MPD<0> to MPD<N2> in the resistance circuit R6 that are arranged on the discharging paths.

In addition, the deactivating the at least one charging path also includes operations of generating, by each of the multiplexer circuits MUX_DN1_0-MUX_DN1_N1 and MUX_DN2-MUX_DN2_N2, a resistance control signal (i.e., one of the resistance control signals PD<0> to PD<N1> and PD<0> to PD<N2>) to turn off one of the NMOS transistors MPD<0> to MPD<N1> in the resistance circuit R4 and MPD<0> to MPD<N2> in response to a resistance control signal (i.e., the resistance control signal PDR1<0:N1> or PDR1<0:N2>).

In some embodiments, first terminals of the PMOS transistors MPU<0> to MPU<M2> in the resistance circuit R3 are connected with first terminals of the NMOS transistors MPD<0> to MPD<N2> in the resistance circuit R6 at the input/output pad IO.

Furthermore, in some embodiments, the method 900 further includes operations of deactivating, by the pull-up circuit 152, the charging paths and activating, by the pull-down circuit 154, at least one of the discharging paths by turning on at least one of the NMOS transistors RMN7A<1>, MN7C<11>, MN7C<21>, MN7C<31> to MN7C<32>, and MN7C<41> to MN7C<44> and at least one of the NMOS transistors MPD<0> to MPD<N1> in the resistance circuit R4 and MPD<0> to MPD<N2> in the resistance circuit R6.

In some embodiments, the PMOS transistors have a first group of PMOS transistors MPU<0> to MPU<M1> in the resistance circuit R1 coupled in series with the PMOS transistor MP4A<1> and a second group of the PMOS transistors MPU<0> to MPU<M2> in the resistance circuit R3 coupled in series with the PMOS transistors MP4C<11>, MP4C<21>, MP4C<31> to MP4C<32>, and MP4C<41> to MP4C<44>.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended

What is claimed is:

1. An off chip driver circuit, comprising:
a pull-up circuit comprising:
a plurality of first transistors in a plurality of strings coupled in parallel between a voltage terminal and a node; and
a first resistance circuit coupled between the node and an input/output pad, wherein the plurality of first transistors are configured to generate a first voltage through the node coupled to the first resistance circuit, and the first resistance circuit is configured to transmit, in response to a first control signal, the first voltage to the input/output pad and to have a variable resistance according to the first control signal,
wherein a number of the first transistors in a first string of the plurality of strings and a number of the first transistors in a second string of the plurality of strings are different from each other,
wherein each of the first transistors in a first string of the plurality of strings is configured to switch in response to a first switch signal, and
each of the first transistors in a second string of the plurality of strings is configured to switch in response to a second switch signal different from the first switch signal; and
a pull-down circuit comprising a plurality of second transistors and a second resistance circuit coupled between the plurality of second transistors and the input/output pad, wherein the plurality of second transistors are configured to generate a second voltage, different from the first voltage, to the second resistance circuit, and the second resistance circuit is configured to transmit, in response to a second control signal, the second voltage to the input/output pad and to have a variable resistance according to the second control signal;
wherein the first resistance circuit comprises a plurality of third transistors that have first terminals coupled together at the node and second terminals coupled together at the input/output pad, and the plurality of third transistors are configured to be selectively connected electrically to the node to adjust the variable resistance of the first resistance circuit in response to a first supply voltage or a second supply voltage that is transmitted to gates of the plurality of third transistors.

2. The off chip driver circuit of claim 1, wherein the first resistance circuit comprises:
a plurality of multiplexer circuits each configured to generate a third signal in response to the first control signal;
wherein each of the plurality of third transistors is configured to be turned on in response to a corresponding third signal,
wherein the plurality of first transistors and the plurality of third transistors are PMOS transistors.

3. The off chip driver circuit of claim 2, wherein the plurality of third transistors are coupled in parallel between the plurality of first transistors and the input/output pad.

4. The off chip driver circuit of claim 1, wherein the second resistance circuit comprises:
a plurality of multiplexer circuits each configured to generate a third signal in response to the second control signal; and a plurality of fourth transistors coupled in parallel between the plurality of second transistors and the input/output pad, wherein the plurality of fourth transistors are configured to pull down, in response to the third signal, a voltage level of the input/output pad to a ground voltage.

5. The off chip driver circuit of claim 4, wherein the plurality of first transistors are PMOS transistors, and the plurality of second transistors and the plurality of fourth transistors are NMOS transistors.

6. The off chip driver circuit of claim 1, wherein the pull-up circuit further comprises:
a fourth transistor coupled to the voltage terminal providing the first voltage; and
a third resistance circuit coupled between the fourth transistor and the input/output pad, wherein when the fourth transistor is turned on, the third resistance circuit is configured to transmit the first voltage to the input/output pad in response to a third control signal different from the first control signal.

7. The off chip driver circuit of claim 6, wherein the pull-down circuit further comprises:
a fifth transistor coupled to a ground terminal; and
a fourth resistance circuit coupled between the fifth transistor and the input/output pad, wherein the fourth resistance circuit is configured to pull down a voltage level of the input/output pad to a ground in response to a fourth control signal different from the second control signal.

8. The off chip driver circuit of claim 6, the pull-up circuit further comprises:
a plurality of multiplexer circuits each configured to generate, in response to the third control signal, a fourth control signal;
wherein the third resistance circuit comprises a plurality of PMOS transistors coupled with each other in parallel, and
the third resistance circuit is configured to have a variable resistance by the plurality of PMOS transistors being selectively turned on in response to corresponding fourth control signals.

9. An off chip driver system, comprising:
a front-end driver circuit configured to generate a first resistance control signal and a second resistance control signal; and
an off chip driver circuit coupled to the front-end driver circuit and configured to receive the first resistance control signal and the second resistance control signal, wherein the off chip driver circuit comprises:
a plurality of first PMOS transistors in a plurality of strings coupled in parallel between a first voltage terminal and a first node, wherein a number of the first PMOS transistors in a first string of the plurality of strings and a number of the first PMOS transistors in a second string of the plurality of strings are different from each other;
a plurality of second PMOS transistors that have first terminals coupled together at the first node and second terminals coupled together at an input/output pad, wherein the plurality of second PMOS transistors are configured to be selectively turned on in response to the first resistance control signal, wherein the plurality of second PMOS transistors are configured to be selectively connected to the first node, in response to a first supply voltage or a second supply voltage that is transmitted to gates of the plurality of second PMOS transistors, to adjust a resistance value of a path between the first node and the input/output pad;
a plurality of first NMOS transistors coupled between a second voltage terminal and a second node; and
a plurality of second NMOS transistors coupled in parallel between the second node and the input/output pad, wherein the plurality of second NMOS transistors are configured to be selectively turned on in response to the second resistance control signal.

10. The off chip driver system of claim 9, wherein when at least one of the plurality of first PMOS transistors is turned on, at least one of the plurality of second PMOS transistors is turned on, in response to the first resistance control signal, to transmit a first voltage provided by the first voltage terminal to the input/output pad.

11. The off chip driver system of claim 10, wherein when the at least one of the plurality of first PMOS transistors is turned on, the plurality of first NMOS transistors and the plurality of second NMOS transistors are turned off.

12. The off chip driver system of claim 9, wherein the front-end driver circuit is further configured to generate a third resistance control signal;
wherein the off chip driver circuit further comprises:
a third PMOS transistor coupled between the first voltage terminal and the input/output pad;
a plurality of fourth PMOS transistors coupled in parallel between the third PMOS transistor and the input/output pad; and
a plurality of multiplexer circuits each configured to generate a fourth resistance control signal in response to the third resistance control signal, wherein each of the plurality of fourth PMOS transistors is configured to be turned on in response to a corresponding fourth resistance control signal.

13. The off chip driver system of claim 12, wherein an amount of the plurality of second PMOS transistors is different from an amount of the plurality of fourth PMOS transistors.

14. The off chip driver system of claim 9, wherein the off chip driver circuit further comprises:
a plurality of first multiplexer circuits each configured to generate a third resistance control signal in response to the first resistance control signal, wherein each of the plurality of second PMOS transistors is configured to be turned on in response to a corresponding third resistance control signal; and
a plurality of second multiplexer circuits each configured to generate a fourth resistance control signal in response to the second resistance control signal, wherein each of the plurality of second NMOS transistors is configured to be turned on in response to a corresponding fourth resistance control signal.

15. The off chip driver system of claim 9, wherein an amount of the plurality of second PMOS transistors is different from an amount of the plurality of second NMOS transistors.

16. A method for operating an off chip driver circuit, comprising:
activating, by a pull-up circuit, at least one of a plurality of charging paths between a first power rail and a input/output pad by turning on at least one of a plurality of first PMOS transistors and at least one of a plurality of second PMOS transistors that are arranged on the at least one of the plurality of charging paths, wherein a first group of the second PMOS transistors in the plurality of second PMOS transistors have first terminals coupled together at a node and second terminals coupled together at the input/output pad, and the first group of the second PMOS transistors are configured to be selectively connected electrically to the node, in response to a first supply voltage or a second supply voltage that is transmitted to gates of the first group of the second PMOS transistors, to adjust a resistance value of the at least one of the plurality of charging paths,
wherein the plurality of first PMOS transistors in a plurality of strings are coupled in parallel between the first power rail and the node, wherein a number of the first PMOS transistors in a first string of the plurality of strings and a number of the first PMOS transistors in a second string of the plurality of strings are different from each other; and
when the at least one of the plurality of charging paths is activated, deactivating, by a pull-down circuit, a plurality of discharging paths between a second power rail, different from the first power rail, and the input/output pad by turning off a plurality of first NMOS transistors and a plurality of second NMOS transistors that are arranged on the plurality of discharging paths;
wherein first terminals of the plurality of the second PMOS transistors are connected with first terminals of the plurality of second NMOS transistors at the input/output pad.

17. The method for operating the off chip driver circuit of claim 16, wherein the activating the at least one of a plurality of charging paths comprises:
in response to a first resistance control signal, generating, by a first multiplexer circuit, a second resistance control signal to turn on the at least one of the plurality of second PMOS transistors.

18. The method for operating the off chip driver circuit of claim 17, wherein the deactivating the plurality of discharging paths comprises:
in response to a third resistance control signal, generating, by each of a plurality of second multiplexer circuits, a fourth resistance control signal to turn off one of the plurality of second NMOS transistors.

19. The method for operating the off chip driver circuit of claim 16, comprising:
deactivating, by the pull-up circuit, the plurality of charging paths; and
activating, by the pull-down circuit, at least one of the plurality of discharging paths by turning on at least one of the plurality of first NMOS transistors and at least one of the plurality of second NMOS transistors.

20. The method for operating the off chip driver circuit of claim 16, wherein the first group of the second PMOS transistors are coupled in series with a first transistor of the plurality of first PMOS transistors, and a second group of the second PMOS transistors, in the plurality of second PMOS transistors, are coupled in series with remaining ones of the plurality of first PMOS transistors.

* * * * *